United States Patent
Lin et al.

(10) Patent No.: US 6,175,477 B1
(45) Date of Patent: Jan. 16, 2001

(54) SPIN VALVE SENSOR WITH NONMAGNETIC OXIDE SEED LAYER

(75) Inventors: Tsann Lin, Saratoga; Daniele Mauri, San Jose, both of CA (US)

(73) Assignee: International Business Machines Corporation, Armonk, NY (US)

( * ) Notice: Under 35 U.S.C. 154(b), the term of this patent shall be extended for 0 days.

(21) Appl. No.: 08/986,039

(22) Filed: Dec. 5, 1997

(51) Int. Cl.$^7$ .................................................. G11B 5/139
(52) U.S. Cl. ......................................................... 360/324.12
(58) Field of Search ........................ 360/113; 338/32 R; 324/252, 207.21; 428/328–329, 693, 701, 900

(56) References Cited

U.S. PATENT DOCUMENTS

| | | | |
|---|---|---|---|
| 5,206,590 | 4/1993 | Dieny et al. | 324/252 |
| 5,465,185 | 11/1995 | Heim et al. | 360/113 |
| 5,528,440 | 6/1996 | Fontana et al. | 360/113 |
| 5,583,725 | 12/1996 | Coffey et al. | 360/113 |
| 5,665,465 | * 9/1997 | Gyorgy et al. | 428/328 |
| 5,701,223 | * 12/1997 | Fontana, Jr. et al. | 360/113 |

* cited by examiner

*Primary Examiner*—George J. Letscher
(74) *Attorney, Agent, or Firm*—William D. Gill

(57) ABSTRACT

An SV sensor with the preferred structure Substrate/Seed/Free/Spacer/Pinned/AFM/Cap where the seed and cap layers are formed of a non-magnetic, electrically insulating oxide, $NiMnO_x$. The non-magnetic electrically insulating $NiMnO_x$ seed layer results in enhanced GMR coefficient and improved thermal stability of the SV sensor. The improved thermal stability enables use of Ni—Mn with its high blocking temperature and strong pinning field as the AFM layer material, as well as other Mn alloys, without SV sensor performance degradation from the high temperature anneal step needed to develop the desired exchange coupling. The electrically insulating property of the $NiMnO_x$ seed and cap layer material decreases sense current shunting and further reduces shield/sensor shorting.

33 Claims, 9 Drawing Sheets

SPIN VALVE SENSOR WITH NONMAGNETIC OXIDE SEED LAYER

BACKGROUND OF THE INVENTION

1. Field of the Invention

This invention relates generally to spin valve magnetic transducers for reading information signals from a magnetic medium and, in particular, to a spin valve sensor with enhanced GMR effect and improved thermal stability, and to magnetic storage systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR heads, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance of the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV (GMR) effect. In an SV sensor, one of the ferromagnetic layers, referred to as the pinned layer, has its magnetization typically pinned by exchange coupling with an antiferromagnetic (e.g., NiO or Fe—Mn) layer. The pinning field generated by the antiferromagnetic layer should be greater than demagnetizing fields (about 200 Oe) at the operating temperature of the SV sensor (about 120 C) to ensure that the magnetization direction of the pinned layer remains fixed during the application of external fields (e.g., fields from bits recorded on the disk). The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. IBM's U.S. Pat. No. 5,206,590 granted to Dieny et al., incorporated herein by reference, discloses a GMR sensor operating on the basis of the SV effect.

FIG. 1 shows a prior art SV sensor 100 comprising end regions 104 and 106 separated by a central region 102. A free layer (free ferromagnetic layer) 110 is separated from a pinned layer (pinned ferromagnetic layer) 120 by a non-magnetic, electrically-conducting spacer layer 115. The magnetization of the pinned layer 120 is fixed by an antiferromagnetic (AFM) layer 125. Free layer 110, spacer layer 115, pinned layer 120 and the AFM layer 125 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_S$ from a current source 160 to the MR sensor 100. Sensing means 170, typically includes a recording channel such as a partial-response maximum-likelihood (PRML) channel, connected to leads 140 and 145 sense the change in the resistance due to changes induced in the free layer 110 by the external magnetic field (e.g., field generated by a data bit stored on a disk).

As mentioned above, the magnetization of the pinned layer 120 in the prior art SV sensor 100 is generally fixed through exchange coupling with AFM layer 125 of antiferromagnetic material such as Fe—Mn or NiO. However, both Fe—Mn and NiO have rather low blocking temperatures (blocking temperature is the temperature at which the pinning field for a given material reaches zero Oe) which make their use as an AFM layer in an SV sensor difficult and undesirable.

A desirable alternate AFM material is Ni—Mn which has much higher corrosion resistance than Fe—Mn, very large exchange pinning at room temperature, and much higher blocking temperature than either Fe—Mn or NiO. High blocking temperature is essential for SV sensor reliability since SV sensor operating temperatures can exceed 120 C in some applications.

Referring to FIG. 2, there is shown the change in the unidirectional anisotropy field ($H_{UA}$) or pinning field versus temperature for 50 Å thick Ni—Fe pinned layers using Fe—Mn, NiO and Ni—Mn as the pinning layers. Fe—Mn has a blocking temperature of about 180 C (curve 210) and NiO has a blocking temperature of about 220 C (curve 220). Considering that a typical SV sensor used in a magnetic recording disk drive should be able to operate reliably at a constant temperature of about 120 C with a pinning field of at least 200 Oe, it can readily be seen that Fe—Mn substantially loses it ability to pin the pinned layer at about 120 C (pinning field dropping to about 150 Oe) and NiO can only marginally provide adequate pinning at about 120 C (pinning field dropping to about 170 Oe). It should be noted that once the pinning effect is lost, the SV sensor loses its SV effect either totally or partially, rendering the SV sensor useless. In contrast, it can be seen in FIG. 2 that Ni—Mn with a blocking temperature of beyond 450 C (curve 230) easily meets the pinning field requirements at the 120 C operating temperature of typical SV sensors.

However, the problem with using Ni—Mn AFM for the pinning layer is the requirement for a high temperature (equal or greater than 240 C) annealing step after the deposition of the SV sensor layers (post-annealing) to achieve the desired exchange coupling between the Ni—Mn pinning layer and the Ni—Fe pinned layer in order to achieve proper SV sensor operation. Unfortunately, annealing at such high temperature (equal or greater than 240 C) substantially degrades the GMR coefficient of the SV sensor. This irreversible degradation of the SV sensor is believed to be caused by interdiffusion at layer interfaces. Stability against this interdiffusion is a prerequisite for the use of Ni—Mn as the AFM layer in an SV sensor because the SV sensor must survive the severe heat treatment required to anneal the Ni—Mn. In addition, the magnetostriction of the free layer increases sharply after annealing. This increase in the magnetostriction is believed to be caused by intermixing at the interface between the seed layer and the free layer.

Therefore there is a need for an SV sensor using a Ni—Mn AFM pinning layer that can withstand the annealing step required to achieve the desired exchange coupling without the undesirable degradation of the SV effect and without problems in control of magnetostriction of the free layer.

SUMMARY OF THE INVENTION

It is an object of the present invention to disclose an improved seed layer for SV sensors with the film structure Seed/Free/Spacer/Pinned/AFM/Cap wherein the improved seed layer results in enhanced GMR effect and improved thermal stability.

It is another object of the present invention to disclose an SV sensor having an improved seed layer which allows the use of a Ni—Mn layer as the pinning layer.

It is a further object of the present invention to disclose an improved SV sensor having the film structure $NiMnO_x$/Ni—Fe/Co/Cu/Co/Ni—Mn/Ta wherein the annealing step to develop exchange coupling is carried out without serious degradation of the GMR effect.

It is a further object of the present invention to disclose an improved SV sensor having the film structure $NiMnO_x$/Ni—Fe/Co/Cu/Co/Ni—Mn/$NiMnO_y$ wherein the annealing step to develop exchange coupling is carried out without serious degradation of the GMR effect.

It is yet another object of the present invention to disclose an SV sensor having a nonmagnetic seed layer and a cap layer wherein said seed layer and cap layer form part of the top and bottom read gaps, respectively, resulting in reduced shield to sensor shorting.

In accordance with the principles of the present invention, there is disclosed an SV sensor with the preferred structure of Substrate/$NiMnO_x$/Ni—Fe/Co/Cu/Co/Ni—Mn/$NiMnO_y$. The $NiMnO_x$ seed layer on the substrate affects the properties of subsequent layers deposited over said seed layer resulting in improved GMR effect and improved thermal stability of the SV sensor.

In accordance with the principles of an alternative embodiment of the present invention, there is disclosed an SV sensor with the preferred structure of Substrate/$NiMnO_x$/Ni—Fe/Co/Cu/Co/Ni—Mn/Ta. The $NiMnO_x$ seed layer on the substrate affects the properties of subsequent layers deposited over said seed layer resulting in improved GMR effect and improved thermal stability of the SV sensor.

In accordance with the principles of an alternative embodiment of the present invention, there is disclosed an anti-parallel (AP)-pinned SV sensor with the preferred structure of Substrate/$NiMnO_x$/Ni—Fe/Co/Cu/AP1/APC/AP2/Ni—Mn/Ta where AP1 is the first AP-pinned layer, AP2 is the second AP-pinned layer and APC is an anti-parallel coupling layer. The $NiMnO_x$ seed layer on the substrate affects the properties of subsequent layers deposited over said seed layer resulting in improved GMR effect and improved thermal stability of the AP-pinned SV sensor.

The $NiMnO_x$ and $NiMnO_y$ materials used in forming the seed layer and the cap layer, respectively, of the SV sensor of the preferred embodiment of the present invention is non-magnetic and electrically insulating. The non-magnetic, electrically insulating seed layer and cap layer form part of the bottom read gap and the top read gap, respectively, which separate the SV sensor from the bottom and top magnetic shields respectively. The use of electrically insulating material for the seed layer and the cap layer reduces SV sensor to shield shorting and does not add to sense current shunting as does the use of metal seed layers and cap layers.

The above as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG., 1 is an air bearing surface view of a prior art SV sensor.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
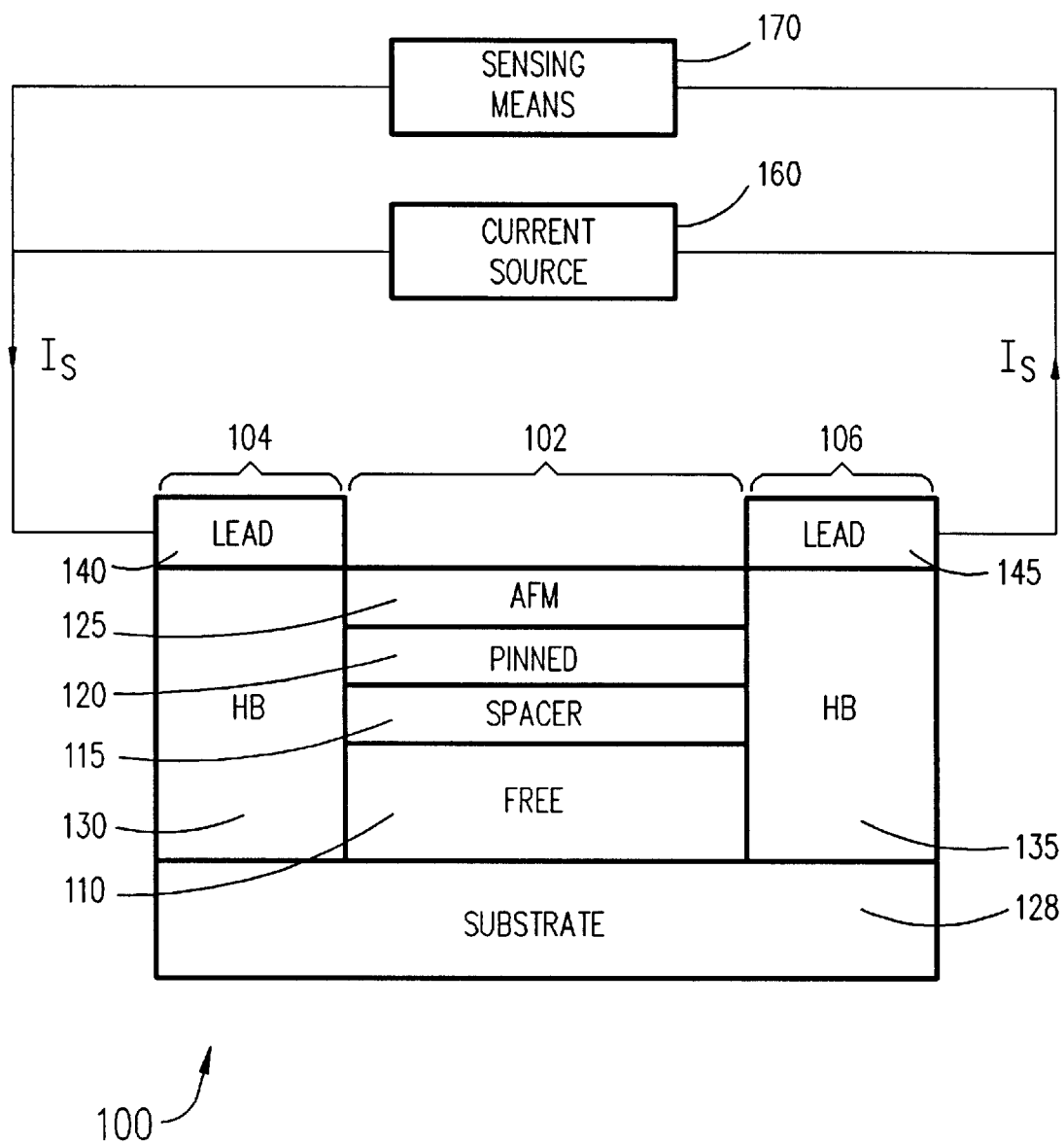
Figure 2:
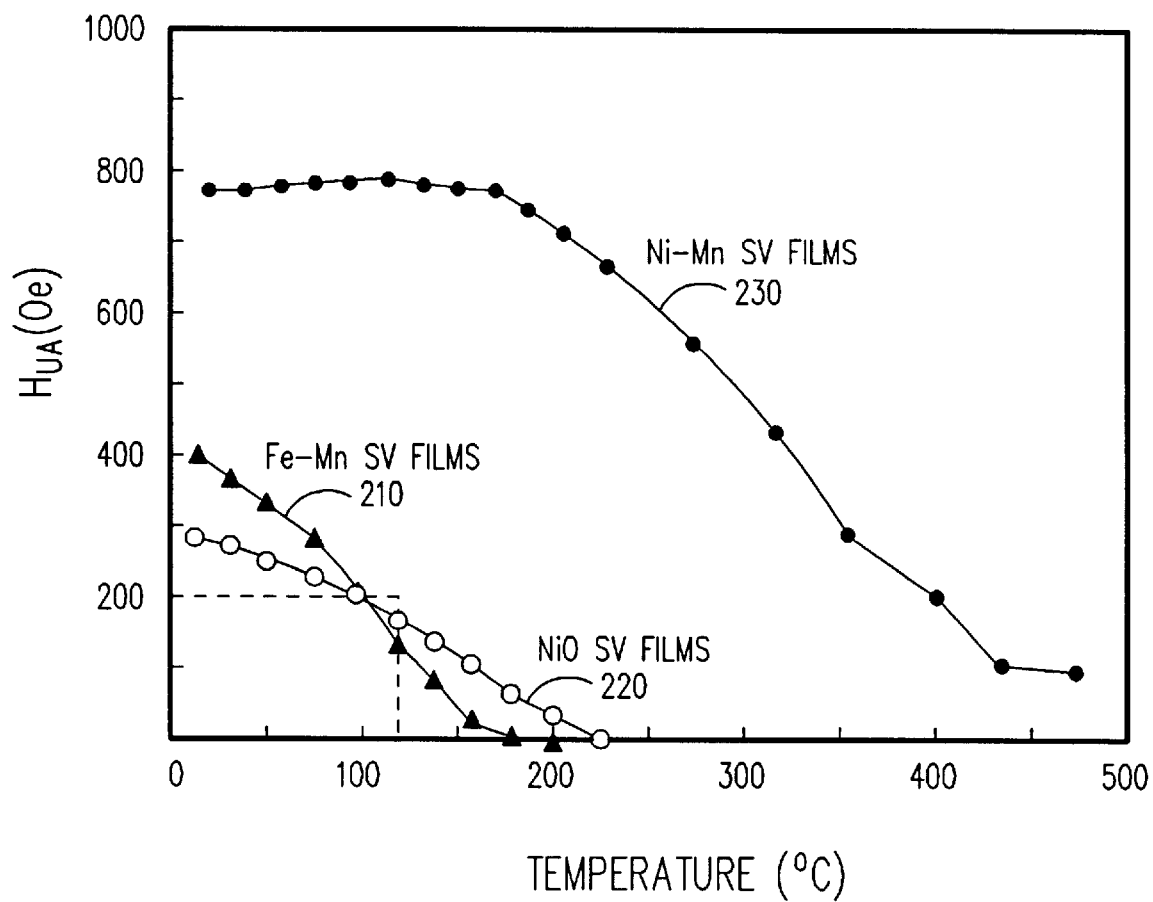
FIG. 2 is a graph showing temperature dependence of the pinning fields for exchange coupling of Fe—Mn, NiO and Ni—Mn antiferromagnetic pinning layers to Ni—Fe ferromagnetic pinned layers.
Figure 3:
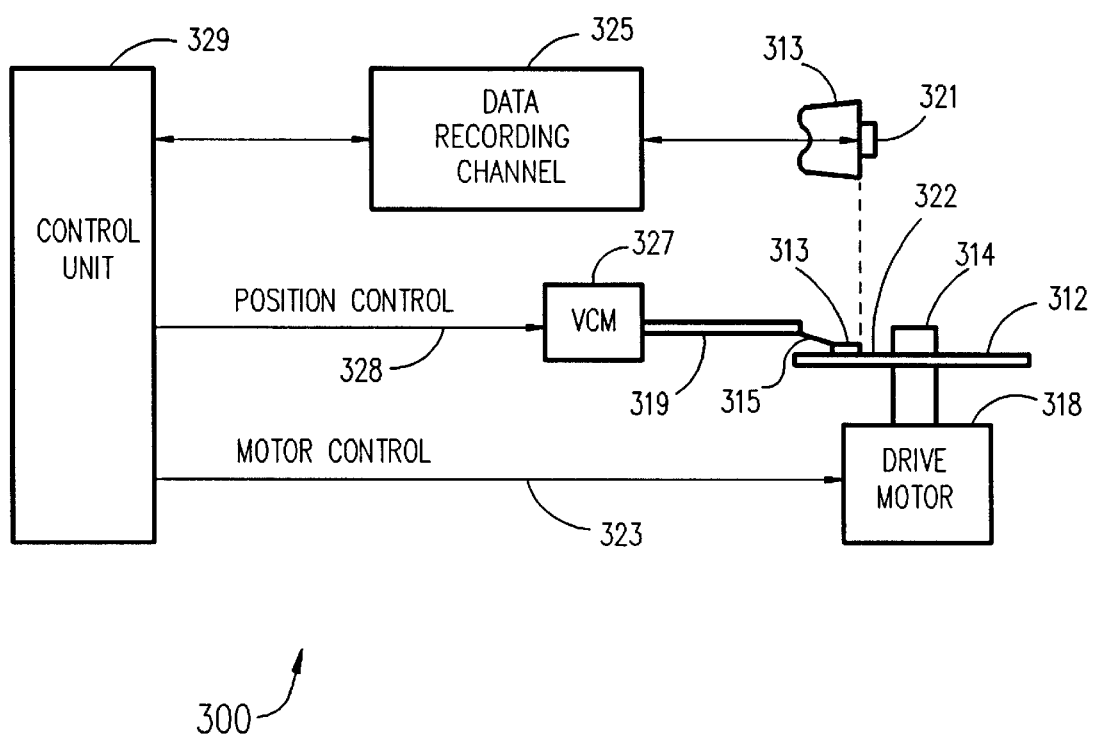
FIG. 3 is a simplified drawing of a magnetic recording disk drive system of the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
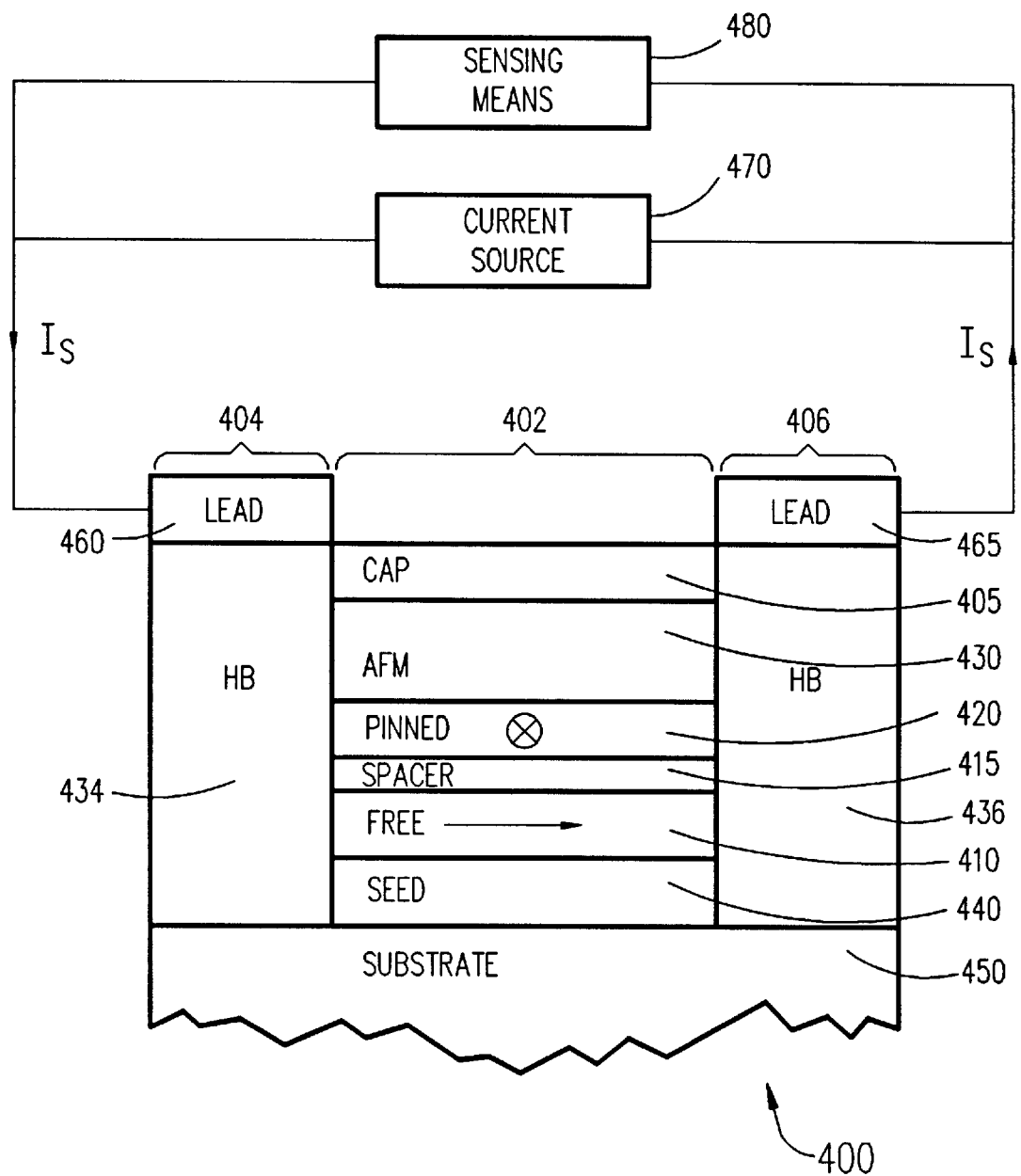
FIG. 4 is an air bearing surface view, not to scale, of the SV sensor of the present invention.

FIG. 4 shows an air bearing surface (ABS) view of the SV sensor 400 according to the preferred embodiment of the present invention. SV sensor 400 comprises end regions 404 and 406 separated from each other by a central region 402. The substrate 450 can be any suitable substance, including glass, semiconductor material, or a ceramic material, such as alumina ($Al_2O_3$). The seed layer 440 is a layer deposited to modify the crystallographic structures of the subsequent layers. In previous SV sensors, the seed layer material commonly used is tantalum (Ta). In the present invention, an improved seed layer 440 is formed of $NiMnO_x$ where oxidation is sufficient to make the $NiMnO_x$ nonmagnetic and electrically insulating. A free layer (free ferromagnetic layer) 410, deposited on the seed layer 440, is separated from a pinned layer (pinned ferromagnetic layer) 420 by a non-magnetic spacer layer 415. In the preferred embodiment of the present invention, spacer layer 415, formed over the free layer 410, is also an electrically conducting layer. The magnetization of the free layer 410 is preferably parallel to the ABS in the absence of an external field. The magnetization of the pinned layer 420 is fixed by an antiferromagnetic (AFM) layer 430 and is preferably perpendicular to the ABS. A cap layer 405, deposited on the AFM layer 430, completes the central region 402 of the SV sensor 400. In the present invention, the cap layer 405 is formed of nonmagnetic, electrically insulating $NiMnO_x$.

Referring to FIG. 4, the SV sensor 400 further comprises layers 434 and 436 formed on the end regions 404 and 406, respectively, for providing a longitudinal bias field to the free layer 410 to ensure a single magnetic domain state in the free layer. Lead layers 460 and 465 are also deposited on the end regions 404 and 406, respectively, to provide electrical connections for the flow of the sensing current $I_S$ from a current source 470 to the SV sensor 400. Sensing means 480 which is electrically connected to leads 460 and 465 sense the change in the free layer resistance due to changes induced in the free layer 410 by the external magnetic field (e.g., field generated by a data bit stored on a disk). The external magnetic field acts to rotate the direction of magnetization of the free layer 410 relative to the direction of magnetization of the pinned layer 420 which is preferably pinned perpendicular to the ABS. Sensing means 480 preferably includes a digital recording channel such as a PRML channel as is known to those skilled in the art. Sensing means 480 also includes other supporting circuitries such as a preamplifier (electrically positioned between the sensor and the channel) for conditioning the sensed resistance changes as is known to those skilled in the art.

The SV sensor of the present invention is fabricated using ion beam sputtering methods to sequentially deposit the layers of SV sensor 400 shown in FIG. 4. The sputter deposition process for fabrication of SV sensor 400 is started with deposition on a substrate 450 formed of alumina ($Al_2O_3$) of a seed layer 440 formed of $NiMnO_x$. The $NiMnO_x$ is deposited by reactive sputtering from an Ni—Mn target in an argon/oxygen gas mixture where oxidation is sufficient to result in a nonmagnetic, electrically insulating $NiMnO_x$ layer having a thickness of about 50 Å. Free layer 410 is preferably formed as a laminated structure comprising a Ni—Fe layer 35 Å thick deposited on and in contact with seed layer 440 and a cobalt (Co) layer 10 Å thick deposited on and in contact with the Ni—Fe layer. Alternatively, free layer 410 may be formed of a permalloy (Ni—Fe) film 50 Å thick deposited on and in contact with seed layer 440. Spacer layer 415 formed of a copper (Cu) film 26 Å thick is deposited on and in contact with the free layer 410 and pinned layer 420 formed of a cobalt (Co) film 30 Å thick is deposited on and in contact with the spacer layer 415. AFM layer 430 formed of a Ni—Mn film 250 Å thick is deposited on and in contact with the pinned layer 420. The preferred composition of the Ni—Mn AFM layer is a Mn content in the range between 46 and 60 atomic percent. Cap layer 405 formed of a $NiMnO_y$ film 50 Å thick completes the structure of the central portion 402 of the SV sensor 400.

The preferred composition of the non-magnetic, electrically insulating NiMnO material used to form the seed layer of the present invention may be expressed as follows:

$(Ni_a—Mn_b)_z—O_x$ $a+b=100\%$, $10\%<a<90\%$, $10\%<b<90\%$, and $x+z=100\%$, $45\%<z<95\%$, $5\%<x<55\%$.

The preferred composition of the non-magnetic, electrically insulating NiMnO material used to form the cap layer of the present invention may be expressed as follows:

$(Ni_a\text{—}Mn_b)_z\text{—}O_y$ $a+b=100\%$, $10\%<a<90\%$, $10\%<b<90\%$, and $y+z=100\%$, $45\%<z<95\%$, $5\%<y<55\%$.

In the preferred embodiment of the present invention, NiMnO composition is $(Ni_{50}Mn_{50})_{90}O_{10}$. The as-deposited Ni—Mn AFM layer 430 does not show significant exchange coupling to the underlying pinned layer 420. To develop the desired exchange coupling, SV sensor 400 is thermally annealed at a temperature of 280 C for about 2 hours. In previous Ni—Mn AFM SV sensors, this high temperature annealing process degraded the GMR coefficient due to interdiffusion at layer interfaces of the SV sensor. In the present invention, the use of $NiMnO_x$ as the seed layer for SV sensor 400 results in improved thermal stability of the SV sensor so that after the annealing process at 280 C for about 2 hours to set the Ni—Mn AFM layer exchange coupling with the pinned layer, the SV sensor exhibits a high GMR coefficient, delta R/R, with high unidirectional anisotropy field ($H_{UA}$)

Figure 5A:
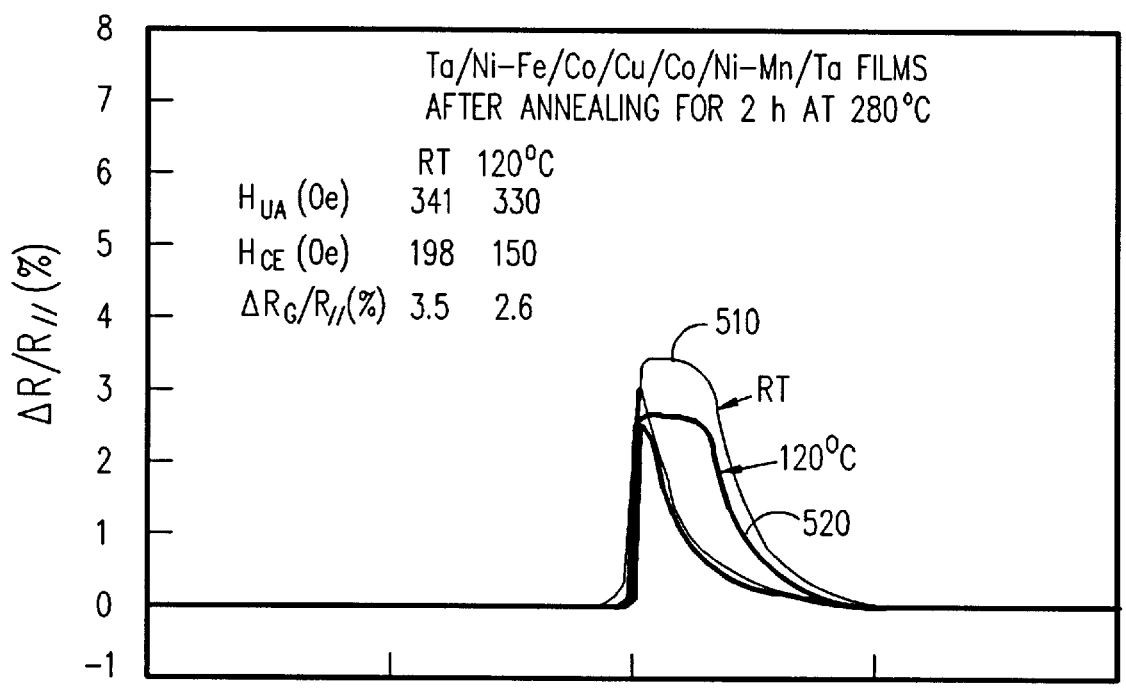
FIGS. 5a and 5b are graphs showing the high field magnetoresistance hysteresis curves of SV sensors fabricated with Ta seed and cap layers and the present invention $NiMnO_x$ seed layer and $NiMnO_y$ cap layer, respectively.
Figure 5B:
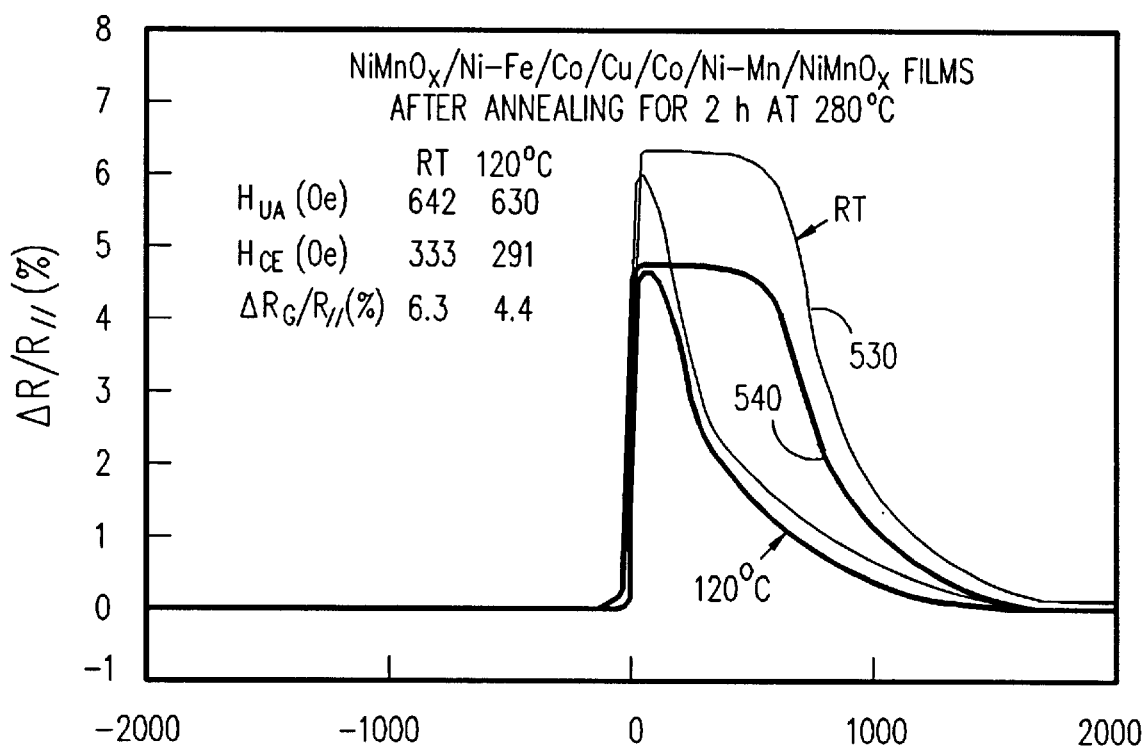

Referring now to FIGS. 5a and 5b, the magnetoresistance of SV sensors fabricated with Ta seed and cap layers and with the $NiMnO_x$ seed and cap layers of the present invention, respectively, are shown (the composition of all other layers in the SV sensors were kept the same). FIG. 5a is a graph of the high field magnetoresistance hysteresis curves obtained at room temperature (RT) 510 and at 120 C 520 for a Ta/Ni—Fe/Co/Cu/Co/Ni—Mn/Ta SV sensor after annealing for 2 hours at 280 C. FIG. 5b is a graph of the high field magnetoresistance hysteresis curves obtained at RT 530 and at 120 C 540 for a $NiMnO_x$/Ni—Fe/Co/Cu/Co/Ni—Mn/$NiMnO_y$ SV sensor after annealing for 2 hours at 280 C. At RT, the GMR coefficient, delta R/R, of 6.3% for the SV sensor fabricated with the $NiMnO_x$ seed and cap layers is an improvement of 80% over the comparable SV sensor fabricated by the same process but with Ta seed and cap layers. At 120 C (typical SV sensor operating temperature), the delta R/R of 4.4% is an improvement of 69% over the SV sensor with Ta seed and cap layers. The unidirectional anisotropy field, $H_{UA}$, of 630 Oe and the coercivity, $H_{CE}$, of 291 Oe at 120 C remain nearly as high as the values at room temperature. These values are higher than those for the SV sensor with Ta seed and cap layers.

Further annealing of the Ni—Mn AFM SV sensors with Ta and $NiMnO_x$ seed layers for up to 20 hours at 260 C does not cause any noticeable changes in $H_{UA}$, $H_{CE}$ and delta R/R. This indicates that, in the magnetic head (merged read sensor and write head) fabrication process where hardbakes of photoresists and annealing of write head poles at temperatures up to 260 C are performed, no noticeable changes in $H_{UA}$, $H_{CE}$ and delta R/R properties occur. To find the upper limit of thermal stability, these Ni—Mn AFM SV sensors were further annealed at 280 C, a high temperature typically not used for the head fabrication process.

Figure 6A:
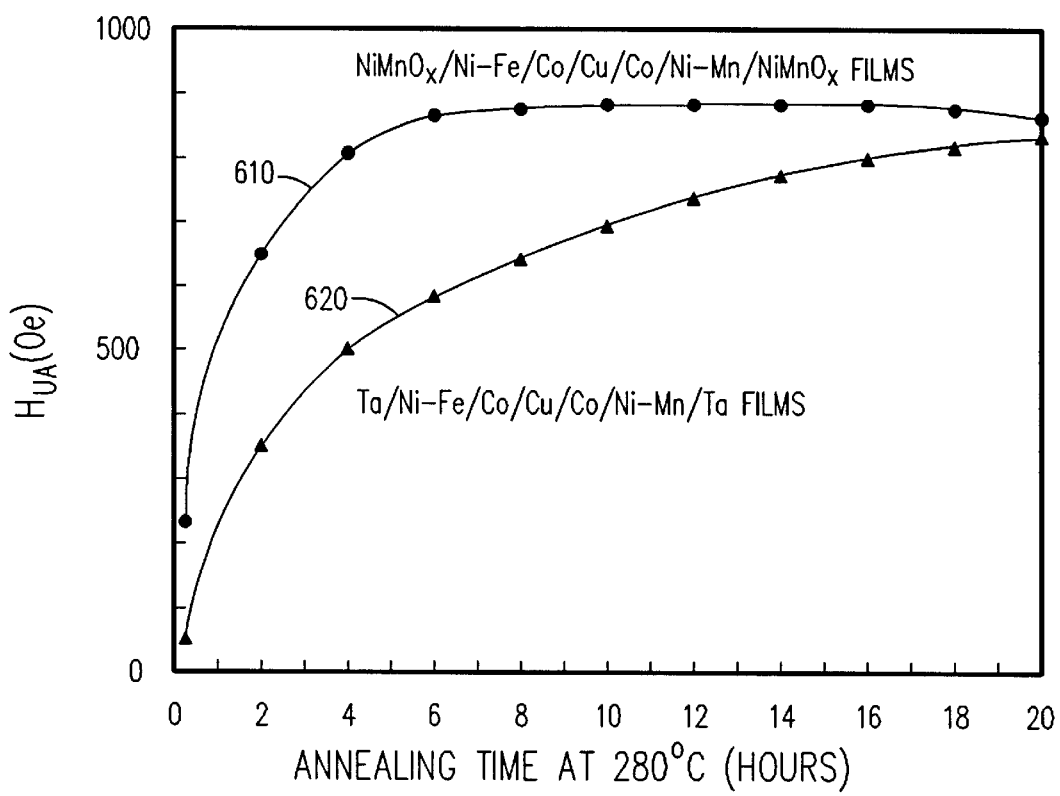
FIGS. 6a and 6b are graphs showing the effect of annealing time at 280 C on the unidirectional anisotropy fields and the GMR coefficients, respectively, for the Ni—Mn SV sensors with Ta and $NiMnO_x$ seed layers.
Figure 6B:
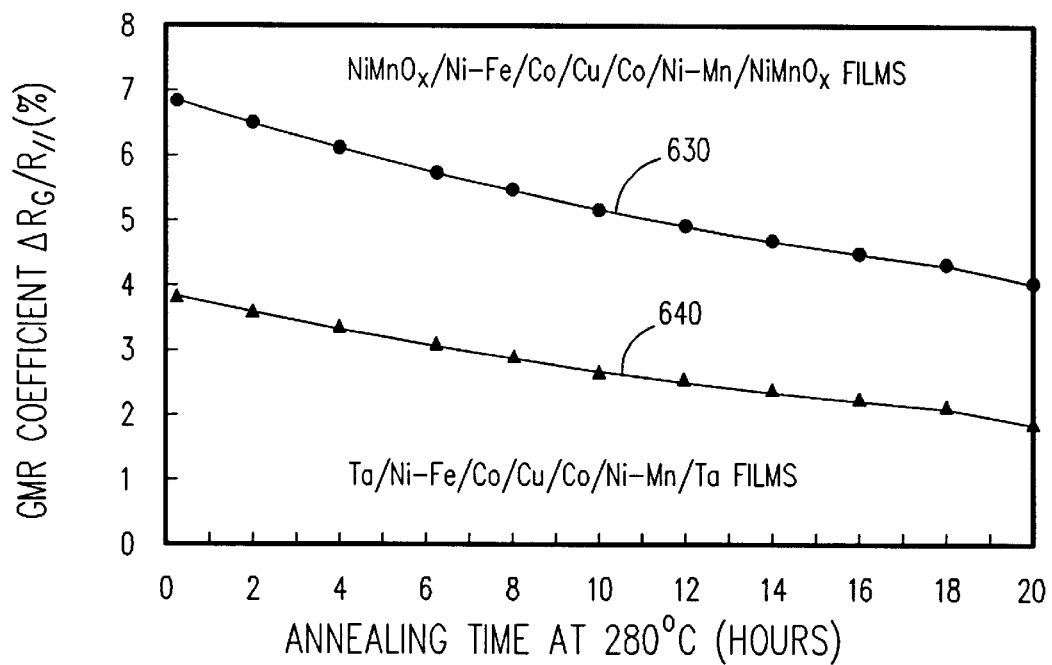

FIGS. 6a and 6b show $H_{UA}$ and delta R/R, respectively, versus annealing time at 280 C for $NiMnO_x$/Ni—Fe/Co/Cu/Co/Ni—Mn/$NiMnO_x$ and Ta/Ni—Fe/Co/Cu/Co/Ni—Mn/Ta SV sensors. As shown in FIG. 6a, $H_{UA}$ continues to increase with annealing time, reaching a value of approximately 640 Oe in 2 hours for the SV sensor with $NiMnO_x$ seed layer 610 while taking 8 hours to reach the same value for the SV sensor with Ta seed layer 620. Therefore, it is apparent that the use of the $NiMnO_x$ seed layer leads to faster development of exchange coupling. On the other hand, as shown in FIG. 6b the GMR coefficients of both Ni—Mn SV sensors 630, 640 decrease with annealing time. However, the GMR coefficient of the Ni—Mn SV sensor with the $NiMnO_x$ seed layer 630 after annealing for 20 hours is still higher than that of the Ni—Mn SV sensor with the Ta seed layer 640 after annealing for only 2 hours. This demonstrates the excellent thermal stability of the Ni—Mn SV sensor of the present invention.

This improvement in thermal stability may originate from unbonded "active" oxygen elements at the $NiMnO_x$/Ni—Fe interface which are redistributed in interstitial sites after annealing, thereby preventing interdiffusion of metallic elements. In addition, the elimination of intermixing of Ta, Ni and Fe elements leads to easier control of magnetostriction of the free layer.

Figure 7:
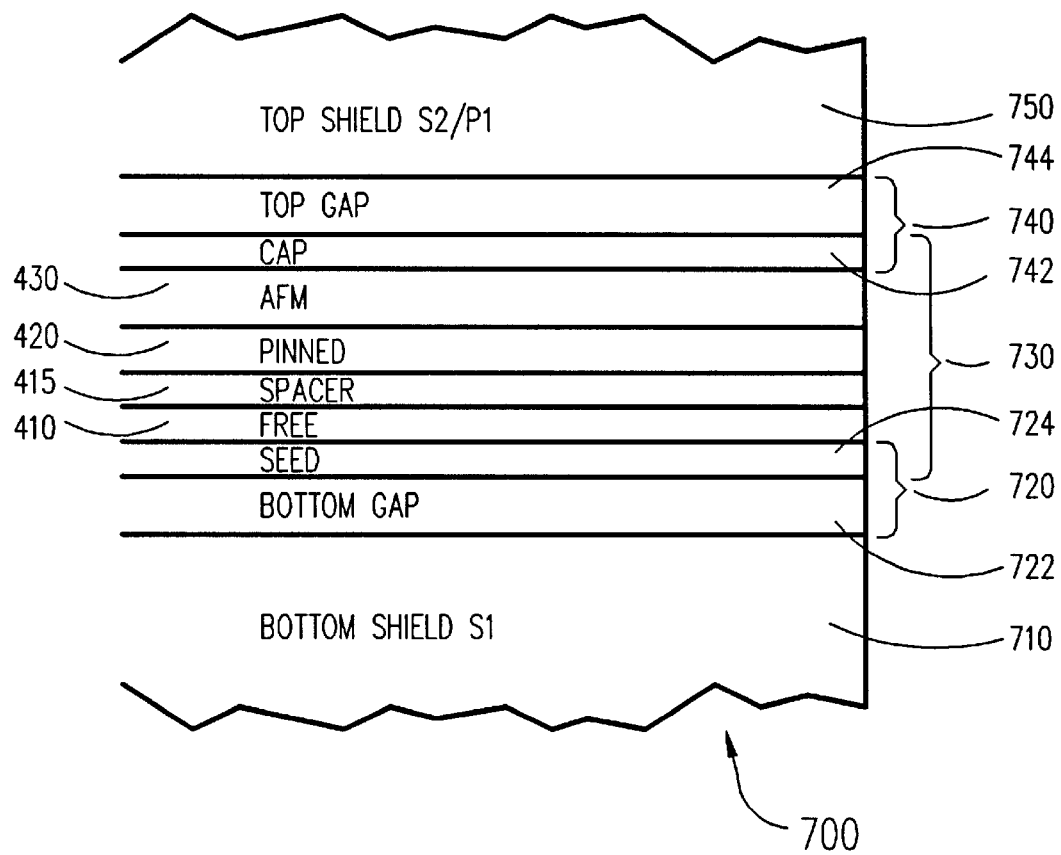
FIG. 7 is a sectional view perpendicular to the air bearing surface of the read head of the present invention including the SV sensor and the shield layers.

FIG. 7 is a sectional view perpendicular to the ABS of the SV sensor of the present invention showing a section through the central region 402 and including the shield and gap structure of the read head. The read head 700 comprises SV sensor 730 disposed between and in contact with bottom read gap 722 and top read gap 744 which in turn lie between bottom shield 710, $S_1$, and top shield 750, $S_2$. In merged read/write head structures, top shield $S_2$ also serves as the bottom pole $P_1$ of the write head which is formed on top of the read head structure 700. Shields $S_1$ and $S_2$, which serve to shield the SV sensor from unwanted magnetic fields, are formed of low coercivity ferromagnetic material such as permalloy which are also electrically conductive. Bottom gap 722 and top gap 744 must be formed of electrically insulating material to prevent electrical shorting of the SV sensor 730 to the bottom and top shields 710, 750, respectively. The commonly used gap material is aluminum oxide ($Al_2O_3$). For the SV sensor 730 of the present invention, seed layer 724 is formed of electrically insulating $NiMnO_x$ formed on the bottom gap 722, and therefore forms a laminated bilayer bottom gap 720. Similarly, cap layer 742 is formed of electrically insulating $NiMnO_y$ on which the top gap 744 is deposited, therefore forming a laminated bilayer top gap 740. The additional electrical insulation provided by seed layer 724 and cap layer 742 to the bottom gap 722 and the top gap 744, respectively, minimizes shield/SV sensor shorting in this read head structure. The use of electrically insulating $NiMnO_x$ for the seed and cap layers of SV sensors, replacing the prior art tantalum layers, also reduces sense current shunting providing a further improvement in the SV sensors of the present invention.

Figure 8:
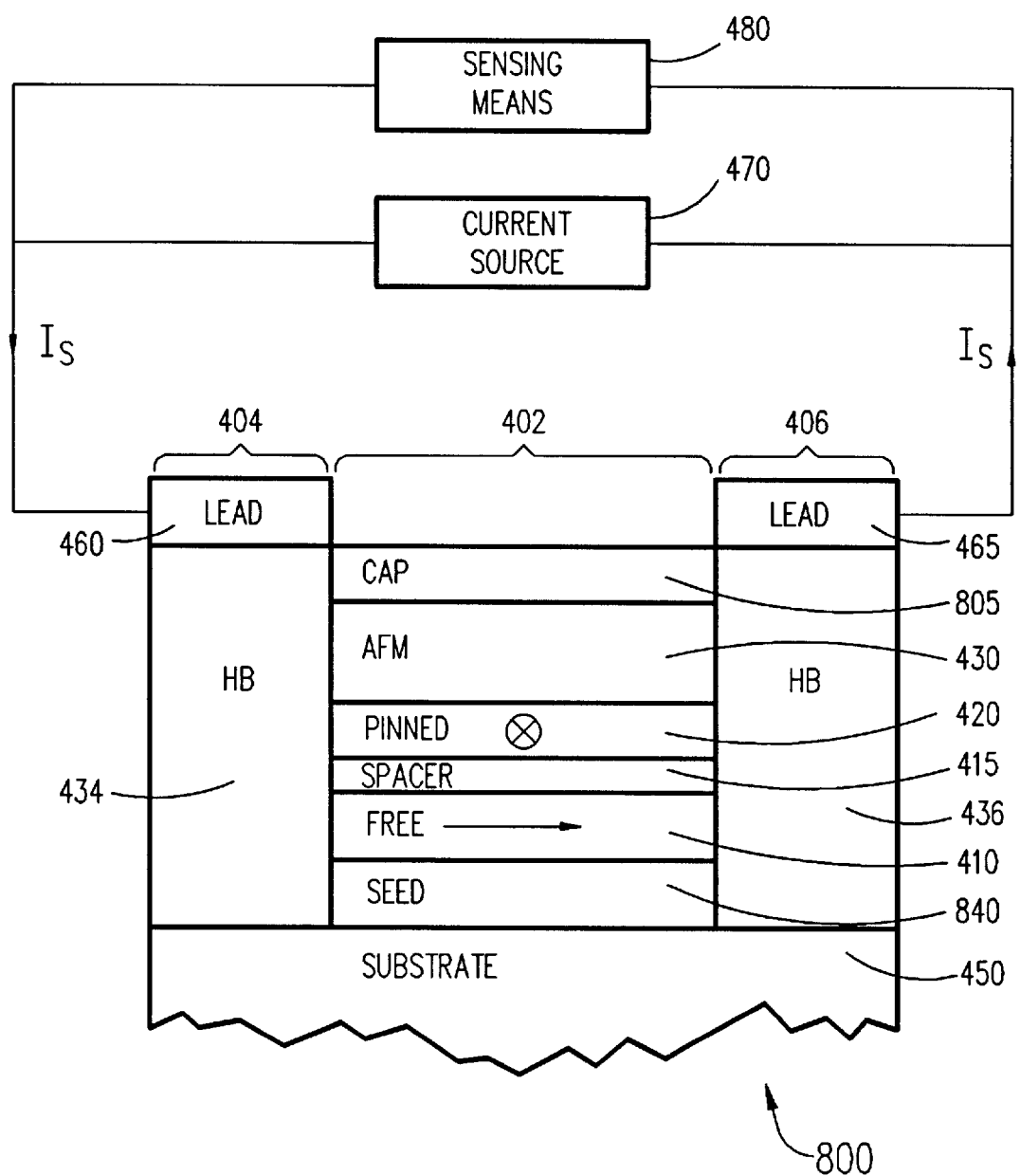
FIG. 8 is an air bearing surface view, not to scale, of an alternative embodiment of the SV sensor of the present invention.

FIG. 8 shows an ABS view of the SV sensor 800 according to an alternate embodiment of the present invention. Seed layer 840 is a layer of $NiMnO_x$ having a thickness of about 50 Å deposited on substrate 450. Free layer 410 is formed as a laminated structure comprising a permalloy (Ni—Fe) layer having a thickness of 35 Å deposited on and in contact with seed layer 840 and a Co layer having a thickness of 10 Å deposited on and in contact with the Ni—Fe layer. Alternatively, free layer 410 may be formed of a single Ni—Fe layer having a thickness of 50 Å deposited on and in contact with seed layer 840. Spacer layer 415 formed of a Cu film having a thickness of 26 Å is deposited on and in contact with the free layer 410. Pinned layer 420 formed of a Co film having a thickness of 30 Å is deposited on and in contact with the spacer layer 415. AFM layer 430 formed of a Ni—Mn film having a thickness of 250 Å is deposited on and in contact with pinned layer 420. Cap layer 805 formed of tantalum (Ta) is deposited on the AFM layer 430. To develop the desired exchange coupling of the Ni—Mn AFM layer 430 to the underlying pinned layer 420, SV sensor 800 is thermally annealed at a temperature of 280 C for a period of 2 hours. After this annealing process to set the Ni—Mn layer exchange coupling with the pinned layer, SV sensor 800 exhibits high GMR coefficient and high unidirectional anisotropy field, $H_{UA}$.

Figure 9:
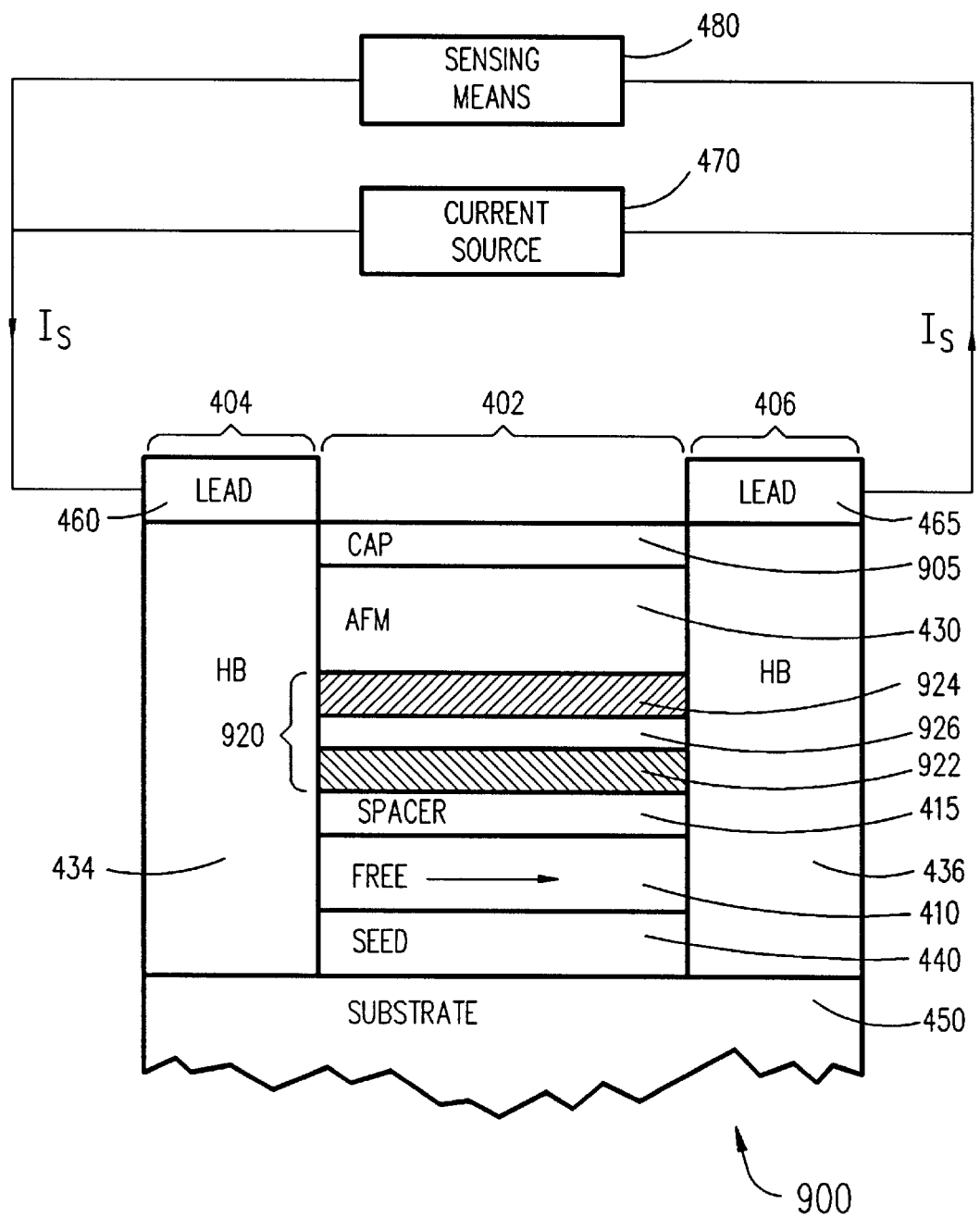
FIG. 9 is an air bearing surface view, not to scale, of another alternative embodiment of the SV sensor of the present invention.

FIG. 9 shows an ABS view of an antiparallel(AP)-pinned SV sensor 900 according to an another alternative embodiment of the present invention. All the layers of AP-pinned SV sensor 900 are same as those of SV sensor 400 except for pinned layer 420 and cap layer 405 which are replaced by laminated AP-pinned layer 920 and cap layer 905, respectively. Laminated AP-pinned layer 920 comprises a first ferromagnetic pinned layer 922 and a second ferromagnetic pinned layer 924 separated from each other by an antiparallel coupling (APC) layer 926 of nonmagnetic material that allows said first and second ferromagnetic pinned layers 922, 924 to be coupled together antiferromagnetically. First pinned layer 922 may be made of Co, NiFe or Co/Ni—Fe. Second pinned layer 924 may be made of Co or Ni—Fe. APC layer 926 may be made of ruthenium (Ru), iridium (Ir) or Rhodium (Rh). Cap layer 905 is preferably formed of nonmagnetic, electrically insulating $NiMnO_x$. Alternatively, cap layer 905 may be formed of tantalum (Ta). U.S. Pat. No. 5,465,185 granted to Heim et al., Nov. 7, 1995, and incorporated herein by reference, discloses an AP-pinned SV sensor and its principle of operation.

It will be apparent to those skilled in the art that alternative AFM layer 430 materials such as Fe—Mn, Pd—Mn, Pt—Mn, Pd—Pt—Mn, Ir—Mn, Rh—Mn, Ru—Mn and Cr—Mn—Pt may also be used to fabricate SV sensors according to the present invention.

It will also be apparent to those skilled in the art that alternative spacer layer 415 materials such as gold and silver may also be used to fabricate SV sensors according to the present invention.

It will be further apparent to those skilled in the art that alternative pinned layer 420 materials such as permalloy (Ni—Fe) and laminated multilayer films such as Ni—Fe/Co may be used to fabricate SV sensors according to the present invention.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

We claim:

1. A magnetoresistive sensor, comprising:

a seed layer of non-magnetic electrically insulating material deposited on a substrate;

a free layer of ferromagnetic material deposited over said seed layer;

a spacer layer of non-magnetic material deposited over said free layer;

a pinned layer of ferromagnetic material deposited over said spacer layer; and an antiferromagnetic (AFM) layer deposited over said pinned layer for pinning the magnetization of said pinned layer.

2. The SV sensor as recited in claim 1, wherein said free layer includes first and second free sub-layers where said first free sub-layer is made of a ferromagnetic material which is different from said second free sub-layer ferromagnetic material.

3. The SV sensor as recited in claim 2, wherein said first free sub-layer is made of cobalt and said second free sub-layer is made of Ni—Fe.

4. A magnetoresistive sensor, comprising:

a seed layer of non-magnetic electrically insulating material deposited on a substrate;

a free layer of ferromagnetic material deposited over said seed layer;

a spacer layer of non-magnetic material deposited over said free layer;

a pinned layer of ferromagnetic material deposited over said spacer layer;

an antiferromagnetic (AFM) layer deposited over said pinned layer for pinning the magnetization of said pinned layer; and a cap layer deposited over said AFM layer, said cap layer is made of $NiMnO_y$, where $5\% \leq y \leq 55\%$.

5. The magnetoresistive sensor as recited in claim 4, wherein said seed layer is made of $NiMnO_x$ where $5\% \leq x \leq 55\%$.

6. The magnetoreistive sensor as recited in claim 4, wherein said seed layer is made of $(Ni_a Mn_b)_z O_x$, $10\% \leq a \leq 90\%$, $10\% \leq b \leq 90\%$, $5\% \leq x \leq 55\%$, $45\% \leq z \leq 95\%$, a+b=100% and x+z=100%.

7. The magnetoresistive sensor as recited in claim 4, wherein said AFM layer is made of Ni—Mn.

8. The magnetoresistive sensor as recited in claim 4, wherein said spacer layer is selected from a group of material consisting of copper, gold and silver.

9. The magnetoresistive sensor as recited in claim 4, wherein said AFM layer is selected from a group of material consisting of Fe—Mn, Pd—Mn, Pt—Mn, Pd—Pt—Mn, Ir—Mn, Rh—Mn, Ru—Mn and Cr—Mn—Pt.

10. A magnetoresistive sensor, comprising:

a seed layer of non-magnetic electrically insulating $NiMnO_x$, $5\% \leq x \leq 55\%$, deposited on a substrate;

a free layer of ferromagnetic material deposited over said seed layer;

a spacer layer of non-magnetic material deposited over said free layer;

a pinned layer of ferromagnetic material deposited over said spacer layer; and an antiferromagnetic (AFM) layer deposited over said pinned layer for pinning the magnetization of said pinned layer.

11. The magnetoresistive sensor as recited in claim 10, wherein said seed layer is made of $(Ni_a Mn_b)_z O_x$, $10\% \leq a \leq 90\%$, $10\% \leq b \leq 90\%$, $5\% \leq x \leq 55\%$, $45\% \leq z \leq 95\%$, a+b=100% and x+z=100%.

12. The SV sensor as recited in claim 10, wherein said free layer includes a first and a second free sub-layer where said first free sub-layer is made of a ferromagnetic material which is different from said second free sub-layer ferromagnetic material.

13. The SV sensor as recited in claim 12, wherein said first free sub-layer is made of cobalt and said second sub-layer is made of Ni—Fe.

14. The magnetoresistive sensor as recited in claim 10, wherein said spacer layer is selected from a group of material consisting of copper, gold and silver.

15. The magnetoresistive sensor as recited in claim 10, wherein said AFM layer is made of Ni—Mn.

16. The magnetoresistive sensor as recited in claim 10, wherein said AFM layer is selected from a group of material cosisting of Fe—Mn, Pd—Mn, Pt—Mn, Pd—Pt—Mn, Ir—Mn, Rh—Mn, Ru—Mn and Cr—Mn—Pt.

17. A disk drive system, comprising:

a magnetic recording disk;

a magnetoresistive sensor for sensing magnetically recorded data on said disk, the magnetoresistive sensor comprising:
   a seed layer of non-magnetic electrically insulating material deposited on a substrate;
   a free layer of ferromagnetic material deposited over said seed layer;
   a spacer layer of non-magnetic material deposited over said free layer;
   a pinned layer of ferromagnetic material deposited over said spacer layer; and
   an antiferromagnetic (AFM) layer deposited over said pinned layer for pinning the magnetization of said pinned layer;
an actuator for moving said magnetoresistive sensor across the magnetic recording disk so the magnetoresistive sensor may access different regions of magnetically recorded data on the magnetic recording disk; and
a recording channel coupled electrically to the magnetoresistive sensor for detecting changes in resistance of the magnetoresistive sensor caused by rotation of the magnetization axis of the free ferromagnetic layer relative to the fixed magnetization of the pinned layer in response to magnetic fields from the magnetically recorded data.

18. The disk drive system as recited in claim 17, wherein said free layer includes a first and a second free sub-layer where said first free sub-layer is made of a ferromagnetic material which is different than said second free sub-layer ferromagnetic material.

19. The disk drive system as recited in claim 18, wherein said first free sub-layer is made of cobalt and said second sub-layer is made of Ni—Fe.

20. A disk drive system, comprising:
a magnetic recording disk;
a spin valve (SV) magnetoresistive sensor for sensing magnetically recorded data on said disk, the SV sensor comprising:
   a seed layer of non-magnetic electrically insulating material deposited on a substrate;
   a free layer of ferromagnetic material deposited over said seed layer;
   a spacer layer of non-magnetic material deposited over said free layer;
   a pinned layer of ferromagnetic material deposited over said spacer layer;
   an antiferromagnetic (AFM) layer deposited over said pinned layer for pinning the magnetization of said pinned layer; and
   a cap layer deposited over said AFM layer, said cap layer is made of non-magnetic electrically insulating $NiMnO_y$, $5\% \leq y \leq 55\%$;
an actuator for moving said SV sensor across the magnetic recording disk so the SV sensor may access different regions of magnetically recorded data on the magnetic recording disk; and
a recording channel coupled electrically to the SV sensor for detecting changes in resistance of the SV sensor caused by rotation of the magnetization axis of the free ferromagnetic layer relative to the fixed magnetization of the pinned layer in response to magnetic fields from the magnetically recorded data.

21. The disk drive system as recited in claim 20, wherein said spacer layer is selected from a group of material consisting of copper, gold and silver.

22. The disk drive system as recited in claim 20, wherein said AFM layer is made of Ni—Mn.

23. The disk drive system as recited in claim 20, wherein said AFM layer is selected from a group of material consisting of Fe—Mn, Pd—Mn, Pt—Mn, Pd—Pt—Mn, Ir—Mn, Rh—Mn, Ru—Mn and Cr—Mn—Pt.

24. The disk drive system as recited in claim 20, wherein said seed layer is made of $(Ni_aMn_b)_zO_x$, $10\% \leq a \leq 90\%$, $10\% \leq b \leq 90\%$, $5\% \leq x \leq 55\%$, $45\% \leq z \leq 95\%$, $a+b=100\%$ and $x+z=100\%$.

25. A disk drive system, comprising:
a magnetic recording disk;
a magnetoresistive (MR) sensor for sensing magnetically recorded data on said disk, the MR sensor comprising:
   a seed layer of non-magnetic electrically insulating $NiMnO_x$, $5\% \leq x \leq 55\%$, deposited on a substrate;
   a free layer of ferromagnetic material deposited over said seed layer;
   a spacer layer of non-magnetic electrically conducting material deposited over said free layer;
   a pinned layer of ferromagnetic material deposited over said spacer layer; and
   an antiferromagnetic (AFM) layer deposited over said pinned layer for pinning the magnetization of said pinned layer, said AFM layer is made of an alloy of Mn;
an actuator for moving said MR sensor across the magnetic recording disk so the MR sensor may access different regions of magnetically recorded data on the magnetic recording disk; and
a recording channel coupled electrically to the MR sensor for detecting changes in resistance of the MR sensor caused by rotation of the magnetization axis of the free ferromagnetic layer relative to the fixed magnetization of the pinned layer in response to magnetic fields from the magnetically recorded data.

26. The disk drive system as recited in claim 25 further including a cap layer deposited over said AFM layer, said cap layer is made of non-magnetic electrically insulating $NiMnO_y$, $5\% \leq y \leq 55\%$.

27. The disk drive system as recited in claim 25, wherein said free layer includes a first and a second free sub-layer where said first free sub-layer is made of a ferromagnetic material which is different than said second free sub-layer ferromagnetic material.

28. The disk drive system as recited in claim 27, wherein said first free sub-layer is made of cobalt and said second sub-layer is made of Ni—Fe.

29. The disk drive system as recited in claim 25, wherein said spacer layer is selected from a group of material consisting of copper, gold and silver.

30. The disk drive system as recited in claim 25, wherein said AFM layer is made of Ni—Mn.

31. The disk drive system as recited in claim 25, wherein said AFM layer is selected from a group of material consisting of Fe—Mn, Pd-Mn, Pt-Mn, Pd-Pt-Mn, Ir-Mn, Rh-Mn, Ru-Mn and Cr-Mn-Pt.

32. The disk drive SV sensor as recited in claim 25 wherein said seed layer is made of $(Ni_{50}Mn_{50})_{90}O_{10}$.

33. The disk drive system as recited in claim 25, wherein said seed layer is made of $(Ni_aMn_b)_zO_x$, $10\% \leq a \leq 90\%$, $10\% \leq b \leq 90\%$, $5\% \leq x \leq 55\%$, $45\% \leq z \leq 95\%$, $a+b=100\%$ and $x+z=100\%$.

* * * * *